Oct. 25, 1966 R. E. ANDREWS 3,281,702
WIDE BAND AMPLIFIER HAVING VARIABLE GAIN
Filed Feb. 18, 1963
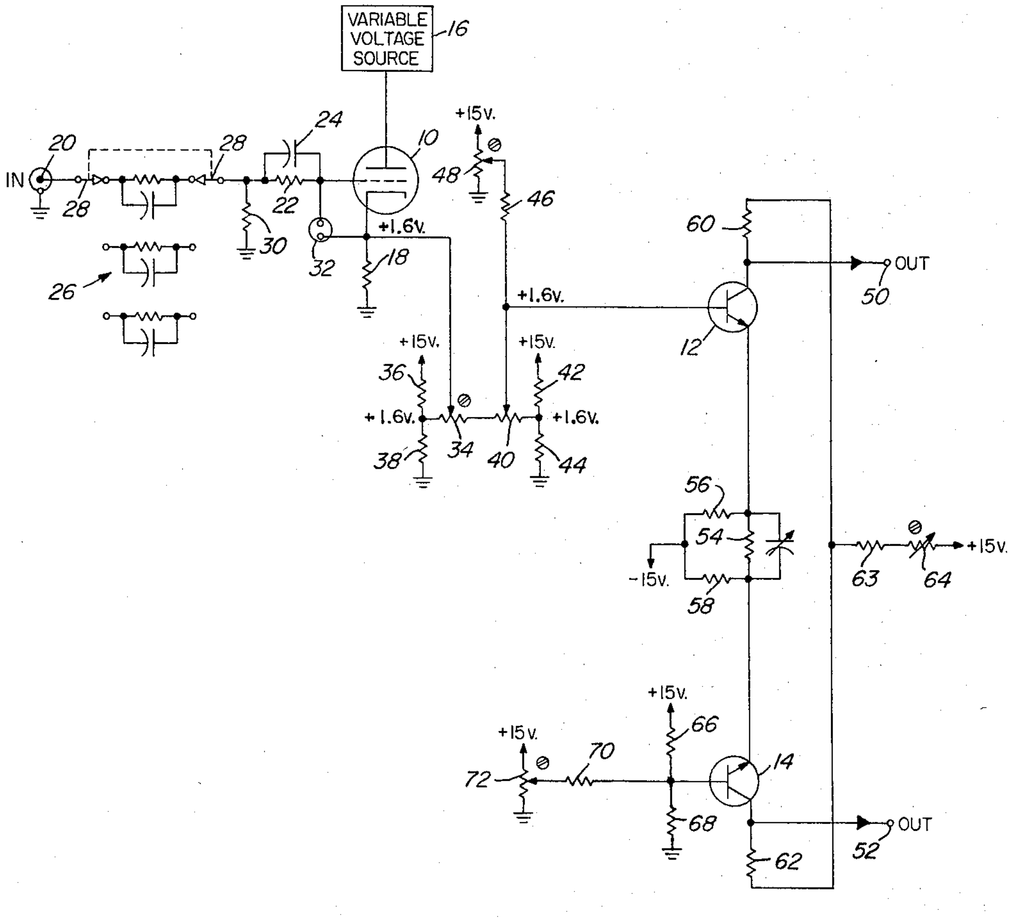
ROLAND E. ANDREWS
INVENTOR.
BY
BUCKHORN, BLORE, KLARQUIST & SPARKMAN
ATTORNEYS United States Patent Office 3,281,702
Patented Oct. 25, 1966

3,281,702
WIDE BAND AMPLIFIER HAVING VARIABLE GAIN

Roland E. Andrews, Portland, Oreg., assignor to Tektronix, Inc., Beaverton, Oreg., a corporation of Oregon
Filed Feb. 18, 1963, Ser. No. 259,076
6 Claims. (Cl. 330—3)

The subject matter of the present invention relates generally to electrical amplifier circuits, and in particular to wide band D.C. coupled amplifiers having variable gain.

Briefly the amplifier circuit of the present invention includes a pair of amplifier stages which are connected together by a coupling network having variable gain control potentiometers forming part of the coupling network so that for various positions of the potentiometers the total overall gain of the amplifier circuit changes while the internal gain of the individual amplifier stages remain substantially constant. This enables the present amplifier circuit to have a substantially constant frequency bandwidth response. The amplifier circuit of the present invention also includes a means for balancing the quiescent D.C. voltages applied to the coupling network so that substantially no D.C. current flows through the gain control potentiometers in order to maintain a substantially constant quiescent D.C. output voltage for such amplifier circuit regardless of the setting of such potentiometers.

The present amplifier circuit is especially useful as the vertical input preamplifier of a cathode ray oscilloscope having a bandwidth frequency response from D.C. to several megacycles per second. In order to adjust the voltage amplitude of the vertical input signal applied to the input of such preamplifier so that its wave form can be displayed upon the fluorescent screen of the cathode ray tube in such oscilloscope, the gain of the preamplifier must be varied, either continuously or in calibrated steps until the displayed signal is of the proper size. Previous vertical preamplifiers have not had a calibrated continuously variable gain control for varying the voltage of the output signal of such preamplifiers, because the different settings of this control also varied the frequency response of the preamplifier.

The amplifier circuit of the present invention has several advantages over conventional variable gain amplifiers including the advantage that the wide band frequency response of such circuit remains substantially constant during gain variations. This is the result of the fact that the internal gains of the individual amplifier stages forming the present amplifier circuit remain substantially constant, while the total gain of the amplifier circuit may be changed by varying the setting of a single movable contact on a variable potentiometer forming part of the coupling impedance between such stages. Different settings of the gain control potentiometers in the coupling network do not substantially change the load impedance of the input stage or the source impedance of the output stage so that the internal gains of these stages remain constant.

Also, previous amplifiers have been provided with a plurality of stepped attenuator impedances connected to the input of the amplifier circuit by means of a selector switch. Each of these attenuator impedances is provided with a fixed capacitor connected in parallel with the attenuator resistance to compensate for the input capacitance of its input stage so that the attenuator forms a balanced A.C. and D.C. voltages divider with the input impedance to the stage. However, since the input capacity of an amplifier varies with its gain, any change in the gain of the input stage of conventional amplifiers, such as during the calibration of the amplifier or after movement of the continuously variable gain control will cause the A.C. voltage divider to become unbalanced. This means that the stepped attenuators then do not reduce the gain of the amplifier by predetermined amounts and that the amplifiers is no longer calibrated even for stepped gain variations. The amplifier circuit of the present invention does not suffer from this defect because the calibration of such amplifier is accomplished by means of a gain adjust potentiometer in the coupling impedance between stages which does not change the individual gain of such stages.

Another advantage of the variable gain D.C. coupled amplifier of the present invention is that no quiescent D.C. current flows through the gain control potentiometers of the coupling network so that a change in the setting of these potentiometers does not affect the quiescent D.C. output voltage of such amplifier. This is extremely important in D.C. coupled amplifiers because any change in the quiescent D.C. voltage is amplified and transmitted as a signal by such amplifiers. In addition, the low impedance of the variable gain control coupling network in the amplifier allows the use of a transmission line whose characteristic impedance matches the impedance of such network, to connect the input stage of the amplifier circuit to the coupling network and allows separation of these components for easier packaging.

It is therefore one object of the present invention to provide an improved wide band amplifier circuit having variable gain whose frequency bandwidth response remains substantially constant.

Another object of the invention is to provide an improved amplifier circuit having a variable gain in whch the gains of the individual stages of such amplifier remain substantially constant.

A further object of the present invention is to provide an improved amplifier circuit in which a coupling network for varying the gain of such amplifier circut is connected between two amplifier stages so that the load impedance of the input stage and the source impedance of the output stage remain substantially constant.

Still another object of the invention is to provide an improved variable gain D.C. coupled amplifier circuit having a substantially constant quiescent D.C. output voltage regardless of the variation in the gain of such amplifier circuit.

Additional objects and advantages of the present invention will be apparent from the following details description of a preferred embodiment thereof and from the attached drawings of which:

The figure is a schematic diagram of one embodiment of the amplifier circuit of the present invention.

As shown in the figure, the amplifier circuit has an input stage including a triode vacuum tube 10 and an output stage which includes a pair of NPN-type transistors 12 and 14 which are emitter-coupled to provide a push-pull output. The tube 10 may be connected as a cathode follower amplifier having its anode connected to a variable voltage source 16 which adjusts the voltage on such anode to some value below +100 volts D.C., and its cathode connected to a soure of negative D.C. voltage through a load resistor 18 which also functions as an output bias resistor. The grid of tube 10 is connected to the input terminal 20 of the amplifier circuit through a coupling impedance formed by a resistor 22 connected in parallel with a capacitor 24, and through an attenuator impedance which is selected from a plurality of attenuator impedances 26 by means of a selector switch 28. The attenuator impedance 26 forms a voltage divider with a fixed resistor 30 connected from the grid of tube 10 to ground so that the input voltage to such tube is developed across such fixed resistor. Each of the attenuator impedances 26 is A.C. compensated by a fixed capacitor connected in parallel with the attenuator resistor so that it forms a frequency compensated A.C. voltage divider with the fixed resistor 30 and the input capacitance of the cathode follower tube 10. A neon tube 32 is connected as a voltage regulator from the grid to the cathode of the cathode follower tube 10 in order to prevent the grid bias voltage of such tube from exceeding a predetermined amount.

The output of the cathode follower stage is connected to the movable contact of a first continuously variable, resistance potentiometer 34 forming part of the coupling network between the input and output amplifier stages. One of the end terminals of the first potentiometer 34 is connected between a pair of series connected voltage divider resistors 36 and 38. These voltage divider resistors are connected from a source of positive D.C. voltage to ground and apply a positive D.C. voltage of 1.6 volts to the one end terminal of potentiometer 34. A second continuously variable, resistance potentiometer 40 is connected in series with the first potentiometer 34 with one of its end terminals connected to the other end terminal of such first potentiometer. The other end terminal of the second potentiometer 40 is connected between a pair of series connected voltage divider resistors 42 and 44. The voltage divider resistors 42 and 44 are connected from a positive D.C. voltage source to ground and apply a positive D.C. voltage of 1.6 volts to the other end terminal of potentiometer 40. The variable voltage source 16 connected to cathode follower tube 10 is adjusted until the D.C. voltage at the common connection of the cathode of such tube and the movable contact of potentiometer 34 is also +1.6 volts. The movable contact of potentiometer 40 is connected to the base of transistor 12 and to a source of base current applied through an input bias resistor 46 and a potentiometer 48 whose movable contact is adjusted until the D.C. voltage applied to the movable contact of potentiometer 40 is also +1.6 volts. This means that the quiescent D.C. voltages applied to the variable gain potentiometers 34 and 40 are balanced so that no quiescent D.C. current flows through such potentiometers. Thus, a change in the setting of potentiometers 34 and 40 for varying the gain of the amplifier circuit will produce no change in the quiescent D.C. voltage applied to the base of transistor 12 because there is no D.C. current flow through such potentiometers and the D.C. level output of the amplifier circuit remains substantially constant.

The output stage including transistors 12 and 14 is connected as a paraphase amplifier which converts the output signal of the single ended input stage into a pair of push-pull output signals at output terminals 50 and 52 connected to the collectors of transistors 12 and 14, respectively. The emitters of output transistors 12 and 14 are connected together through a coupling resistor 54 and are connected to a source of negative D.C. bias voltage through a pair of bias resistors 56 and 58. The collectors of these transistors 12 and 14 are both connected through load resistors 60 and 62, respectively, and fixed resistor 63 to a source of positive D.C. bias voltage which may be varied by variable resistor 64. The base of output transistor 14 is connected to a suitable biasing circuit for balancing the quiescent D.C. voltages on the bases of transistors 12 and 14. This biasing circuit may include a pair of voltage divider resistors 60 and 68 which are connected in series between a source of positive D.C. voltage and ground. The base of transistor 14 is connected between voltage divider resistors 66 and 68 and through a coupling resistor 70 to the movable contact of bias potentiometer 72 whose end terminals are connected between a source of positive D.C. bias voltage and ground.

If the resistance of the fixed resistors 36, 38, 42 and 44 and potentiometers 34 and 40 forming the coupling network between the amplifier stages are selected properly, the load resistance of cathode follower amplifier formed by tube 10 including the input resistance $\beta$ $R_e$ of transistor 12 will remain substantially constant for different settings of the potentiometers. Also the source impedance of the common emitter amplifier formed by transistor 12 including the internal resistance 1/gm. of tube 10, will also remain substantially constant for different settings of the gain control potentiometers 34 and 40. Since the load resistance and source resistance of the input stage and output stage, respectively, do not vary appreciably with the setting of potentiometers 34 and 40, the gains of these individual stages do not vary either. Thus, while the effective coupling impedance between input and output stages varies with the setting of the potentiometers 34 and 40 to change the overall gain of the amplifier circuit, the gain of the input and output stages individually remain substantially constant. The frequency bandwidth response of an amplifier is equal to a constant divided by the gain of the amplifier. Therefore, bandwidth of the amplifier stages of the present invention remain substantially constant and so does the bandwidth of the amplifier circuit. The potentiometer 34 may be used to calibrate the amplifier circuit for changes in gain of the tube 10 and transistors 12 and 14 due to aging etc. and is then left in a fixed position while potentiometer 40 alone is used to continuously vary the voltage of the output signal to any value rather than to only the fixed values determined by the attenuator impedances 26.

Since the gain of the cathode follower stage remains substantially constant, the input capacitance of such stage also remains unchanged for various settings of the potentiometers 34 and 40. This enables the attenuation voltage divider, formed by one of the attenuation impedances and the input capacitance and input resistance of such cathode follower stage, to remain frequency compensated for different setting of the calibration potentiometer 34 over the entire bandwidth of the amplifier circuit.

Some typical values of circuit components which may be employed are as follows:

Tube 10=type 7586 nuvistor,
Transistors 12 and 14=type 2N918,
Resistor 18=3.32 kilohms,
Resistor 22=1 megohm,
Capacitor 24=.0068 microfarad,
Resistor 30=1 megohm,
Potentiometer 34=100 ohms,
Resistor 36=3.48 kilohms,
Resistor 38=422 ohms,
Potentiometer 40=250 ohms,
Resistor 42=1.33 kilohms,
Resistor 44=162 ohms,
Resistor 46=33 kilohms,
Potentiometer 48=25 kilohms,
Resistor 54=56.2 ohms,
Resistors 56 and 58=1.54 kilohms,
Resistors 60 and 62=147 ohms,
Resistor 63=464 ohms,
Resistor 64=100 ohms,
Resistor 66=1 kilohm,
Resistor 68=115 ohms,
Resistor 70=10 kilohms,
Potentiometer 72=25 kilohms.

It will be obvious to those having ordinary skill in the art that many changes may be made in the details of the above-described preferred embodiment of the present invention without departing from the spirit of the invention. Therefore, the scope of the present invention should only be determined by the following claims.

I claim:

1. A variable gain D.C. coupled amplifier circuit having a substantially constant frequency bandwidth response and quiescent D.C. output voltage, comprising:

a first amplifier stage including a vacuum tube connected as a cathode follower amplifier;

a second amplifier stage including a transistor connected as a common emitter amplifier;

coupling network means including a variable resistance potentiometer, connected between the cathode of said tube and the base of said transistor for transmitting a portion of the output signal of said first stage to the input of said second stage, and for varying the overall gain of said amplifier circuit in accordance with the setting of said potentiometer while maintaining the load resistance and the individual gain of said first stage and the source resistance and the individual gain of said second stage substantially constant during the variation of said potentiometer; and means for applying substantially the same D.C. bias voltages to said cathode and said base and to all of the terminals of the potentiometer to prevent the flow of quiescent D.C. current through said potentiometer so that the quiescent D.C. output voltage of said amplifier circuit does not change with the setting of said variable resistance potentiometer.

2. A variable gain D.C. coupled amplifier circuit having a substantially constant bandwidth response and quiescent D.C. output voltage, comprising:

a first amplifier stage having an output bias resistor;

a second amplifier stage having an input bias resistor;

coupling network means including a pair of interconnected potentiometers having substantially less resistance than said output resistor and said input resistor having their movable contacts connected to the output and input, respectively, of said first and second stages for transmitting a portion of the output signal of said first stage to the input of said second stage, and for varying the overall gain of said amplifier circuit in accordance with the setting of said potentiometers while maintaining the load resistance and individual gain of said first stage and the source resistance and individual gain of said second stage substantially constant during the variation of said potentiometers; and means for applying the same D.C. bias voltage to all the terminals of the pair of potentiometers preventing the flow of quiescent D.C. current through said potentiometers so that the quiescent D.C. output voltage of said amplifier circuit does not change with the setting of said potentiometers.

3. A variable gain amplifier circuit having a substantially constant bandwidth response, comprising:

a first signal translating device having emitting, collecting and control electrodes connected as a first amplifier stage and having an output bias resistance;

a second signal translating device having emitting, collecting and control electrodes connected as a second stage and having an input bias resistance;

a first variable resistance potentiometer having a resistance less than said output and input resistances and having its movable contact connected to the emitting electrode of said first device;

a second continuously variable, resistance potentiometer having a resistance less than said output and input resistances and having its movable contact connected to the control electrode of said second device, and having one end terminal connected to one end terminal of said first potentiometer;

a first voltage divider having an intermediate terminal connected to the other end terminal of said first potentiometer in order to apply a quiescent D.C. voltage to said other end terminal; and a second voltage divider having an intermediate terminal connected to another end terminal of said second potentiometer in order to apply a quiescent D.C. voltage to said other end terminal which is equal to the D.C. voltage applied to the other end terminal of said first potentiometer.

4. A variable gain amplifier circuit having a substantially constant bandwidth response, comprising:

a discharge device having cathode, anode and grid electrodes connected as a cathode follower amplifier stage;

a semiconductor device having emitter, collector and base electrodes connected as a common emitter amplifier stage;

a first continuously variable potentiometer having its movable contact connected to the cathode of said discharge device for varying the gain of said amplifier circuit;

a second continuously variable potentiometer having its movable contact connected to the base of said semiconductor device, for varying the gain of said amplifier circuit and having one end terminal connected to one end terminal of said first potentiometer;

a first voltage divider having an intermediate terminal connected to the other end terminal of said first potentiometer in order to apply a quiescent D.C. voltage to said other end terminal; and a second voltage divider having an intermediate terminal connected to another end terminal of said second potentiometer in order to apply a quiescent D.C. voltage to said other end terminal which is equal to the D.C. voltage applied to the other end terminal of said first potentiometer, said potentiometers and voltage dividers each having an impedance so that the load impedance of said cathode follower and the source impedance of said common emitter amplifier do not vary with changes in the gain settings of said potentiometers.

5. A variable gain D.C. coupled amplifier circuit having a substantially constant bandwidth response and quiescent D.C. output voltage, comprising:

a vacuum tube having cathode, anode and grid electrodes connected as a cathode follower amplifier stage;

a transistor having emitter, collector and base electrodes connected as a common emitter amplifier stage;

a first continuously variable, resistance potentiometer having its movable contact connected to the cathode of said tube;

a second continuously variable, resistance potentiometer having its movable contact connected to the base of said transistor, and having one end terminal connected to one end terminal of said first potentiometer;

a first voltage divider having its intermediate terminal connected to the other end terminal of said first potentiometer in order to apply a quiescent D.C. voltage to said other end terminal;

a second voltage divider having its intermediate terminal connected to another end terminal of said second potentiometer in order to apply a quiescent D.C. voltage to said other end terminal which is equal to the D.C. voltage applied to the other end terminal of said first potentiometer;

means for varying the quiescent D.C. cathode voltage applied to the movable contact of said first potentiometer so that it equals the D.C. voltage applied to said other end terminal to prevent the flow of quiescent D.C. current through said first potentiometer; and means for varying the quiescent D.C. base electrode voltage applied to the movable contact of said second potentiometer so that it equals the D.C. voltage applied to said another end terminal to prevent the flow of quiescent D.C. current through said second potentiometer.

6. A variable gain D.C. coupled amplifier circuit having a substantially constant bandwidth response and quiescent D.C. output voltage, comprising:

a vacuum tube having cathode, anode and grid electrodes connected as a cathode follower amplifier stage;

a transistor having emitter, collector and base electrodes connected as a common emitter amplifier stage;

a first continuously variable, resistance potentiometer having its movable contact connected to the cathode of said tube;

a second continuously variable, resistance potentiometer having its movable contact connected to the base of said transistor, and having one end terminal connected to one end terminal of said first potentiometer;

a first voltage divider having its intermediate terminal connected to the other end terminal of said first potentiometer in order to apply a quiescent D.C. voltage to said other end terminal;

a second voltage divider having its intermediate terminal connected to another end terminal of said second potentiometer in order to apply a quiescent D.C. voltage to said other end terminal which is equal to the D.C. voltage applied to the other end terminal of said first potentiometer;

means for varying the quiescent D.C. cathode voltage applied to the movable contact of said first potentiometer so that it equals the D.C. voltage applied to said other end terminal;

means for varying the quiescent D.C. base electrode voltage applied to the movable contact of said second potentiometer so that it equals the D.C. voltage applied to said another end terminal;

a plurality of step attenuator impedances; and switch means for connecting selected ones of said attenuator impedances between the input of said amplifier circuit and the grid of said tube.

References Cited by the Examiner

UNITED STATES PATENTS

| | | | |
|---|---|---|---|
| 2,476,900 | 7/1949 | Olson | 330—173 X |
| 2,545,244 | 3/1951 | Smith | 330—173 X |
| 3,024,424 | 3/1962 | Dudziak | 330—173 |

ROY LAKE, *Primary Examiner.*

N. KAUFMAN, *Assistant Examiner.*